United States Patent [19]

Yoshikawa

[11] Patent Number: 4,683,440
[45] Date of Patent: Jul. 28, 1987

[54] HIGH-FREQUENCY AMPLIFIER DEVICE

[75] Inventor: Yoshihiko Yoshikawa, Amagasaki, Japan

[73] Assignee: Mitsubishi Denki Kabushiki Kaisha, Tokyo, Japan

[21] Appl. No.: 833,159

[22] Filed: Feb. 27, 1986

[30] Foreign Application Priority Data

Feb. 28, 1985 [JP] Japan .................................. 58-39079

[51] Int. Cl.$^4$ .............................................. H03F 3/60
[52] U.S. Cl. ........................................ 330/51; 330/56; 330/286; 333/1.1; 333/21 A
[58] Field of Search ..................... 330/51, 53, 56, 286; 333/1.1, 21 A; 343/361, 362, 786, 797

[56] References Cited

U.S. PATENT DOCUMENTS 3,710,280  1/1973  Buck ..................................... 333/1.1
4,498,061  2/1985  Mörz et al. ........................ 333/21 A
4,595,890  6/1986  Cloutier ............................. 333/21 A Primary Examiner—James B. Mullins
Attorney, Agent, or Firm—Leydig, Voit & Mayer

[57] ABSTRACT

A high-frequency amplifier device according to this invention comprises a high-frequency amplifier portion, a high-frequency input portion which is formed of a waveguide and which can transmit polarized signals orthogonal to each other, two detector portions which are inserted in the waveguide of the input portion and which respectively and independently detect the polarized wave signals orthogonal to each other, an irreversible circuit to which the polarized wave signals detected by the detector portions are individually input and which selectively and switching delivers one of the polarized wave signals to the high-frequency amplifier portion and returns the other polarized wave signal to the input portion, and a switching control mechanism for switching and controlling transmitting directions of the irreversible circuit in response to a control signal externally applied.

3 Claims, 9 Drawing Figures

HIGH-FREQUENCY AMPLIFIER DEVICE

BACKGROUND OF THE INVENTION

This invention relates to a high-frequency amplifier device which amplifies or frequency-converts a feeble electric wave received by an antenna or the like.

FIG. 1 is a setup diagram showing an example of a prior-art high-frequency amplifier device, while FIG. 2 is a sectional view showing an example of the practicable structure of the high-frequency amplifier device having the setup in FIG. 1. In the figures, numeral 1 designates a high-frequency amplifier portion, numeral 4 the signal output terminal of the amplifier device, and numeral 7 the case of the amplifier device. Numeral 71 indicates the input flange of the amplifier device, numeral 72 the input portion thereof for a high-frequency signal, which is formed of a waveguide, numeral 73 the detector portion thereof which detects the high-frequency signal transmitted and applied by the waveguide, and numeral 74 the irreversible circuit thereof which is represented by an isolator. The high-frequency amplifier portion 1 has the function of frequency conversion partly or wholly, and the function of high-frequency will be explained as a typical example hereinbelow.

Next, the operation of the prior-art device will be described. The high-frequency signal received by the waveguide input portion 72 is detected by the detector portion 73, and the detected signal is sent to an isolator or the like irreversible element 74 as a coaxial mode or a strip line mode. The irreversible element 74 transmits the signal with a low loss in the direction of arrows as indicated in the figures, whereas it operates to afford a large attenuation to a signal in the reverse direction. Now that the input signal is transmitted in the direction of the illustrated arrows, it is transmitted to the high-frequency amplifier portion 1 with only a low loss. After the input signal is amplified to a required level in the high-frequency amplifier portion 1, it is delivered out from the signal output terminal 4. The high-frequency amplifier portion 1 is so constructed that a plurality of semiconductor amplifier elements are arranged at suitable intervals on a strip line which is made of a dielectric exhibiting low loss characteristics to high frequencies, for example, ceramics or teflon, and that resistors and capacitors for supplying D.C. biases to the semiconductor amplifier elements are added. Bipolar transistors, field-effect transistors, etc. are extensively used as the semiconductor amplifier elements for amplifying the high frequencies. The irreversible element 74 is used for improving the input impedance of the high-frequency amplifier portion 1, or for preventing the high-frequency amplifier portion 1 from causing oscillations etc., under the influence of an oscillator impedance on the input side. When viewed laterally, the waveguide input portion 72 has a shape as shown in FIG. 3. The section of the waveguide input portion 72 is oblong, and the detector portion 73 protrudes into the waveguide input portion 72 as shown in FIG. 2, by way of example. The detector portion 73 detects the input of an electric field in the direction of an arrow indicated in FIG. 3, and sends it to the high-frequency amplifier portion 1.

Since the prior-art high-frequency amplifier device is constructed as described above, it can amplify only the input of the electric field in the direction of the arrow indicated in FIG. 3. Broadcast satellites in recent years often send signals by the use of two orthogonal polarized waves. The prior-art high-frequency amplifier device as shown in FIGS. 1 thru 3 has had the problem that, in order to amplify an input signal of an electric field perpendicular to the arrow, the input flange 71 of the high-frequency amplifier device needs to be detached and then remounted with a rotational angle of 90°. Alternatively, an antenna for receiving the input signals from the satellite needs to be switched so as to receive the perpendicular polarized wave, and to transmit the received wave to the high-frequency amplifier device.

SUMMARY OF THE INVENTION

This invention has been made in order to eliminate the problem as described above, and has for its object to provide a high-frequency amplifier device by which two polarized waves orthogonal to each other can be instantly switched and received and which can be put into a unitary structure directly coupled with the primary radiation system of an antenna.

A high-frequency amplifier device according to this invention comprises a high-frequency amplifier portion, a high-frequency input portion which is formed of a waveguide and which can transmit polarized signals orthogonal to each other, two detector portions which are inserted in the waveguide of the input portion and which respectively and independently detect the polarized wave signals orthogonal to each other, an irreversible circuit to which the polarized wave signals detected by the detector portions are individually input and which selectively and switchingly delivers one of the polarized wave signals to the high-frequency amplifier portion and returns the other polarized wave signal to the input portion, and switching control means to switch and control transmitting directions of the irreversible circuit in response to a control signal externally applied whereby the two orthogonal polarized wave signals can be switched and amplified.

A high-frequency amplifier portion according to this invention may also comprise a high-frequency amplifier portion, a high-frequency waveguide mechanism for transmitting first and second polarized signals orthogonal to each other, first and second detector portions inserted in the waveguide mechanism for detecting the first and second polarized signals, respectively, a three-terminal latching circulator having a first terminal coupled to the first detector, a second terminal coupled to the second detector, and a third terminal coupled to the high-frequency amplifier portion, and control means for switching the signal rotating directions of the latching circulator in response to a control signal externally applied whereby either the first or second signal is supplied to the high-frequency amplifier portion while the other signal and any signal reflected from the high-frequency amplifier portion are returned to the waveguide mechanism.

BRIEF DESCRIPTION OF THE DRAWINGS

Throughout the drawings, the same symbols indicate identical or corresponding portions.

DESCRIPTION OF THE PREFERRED EMBODIMENTS

Figure 4:
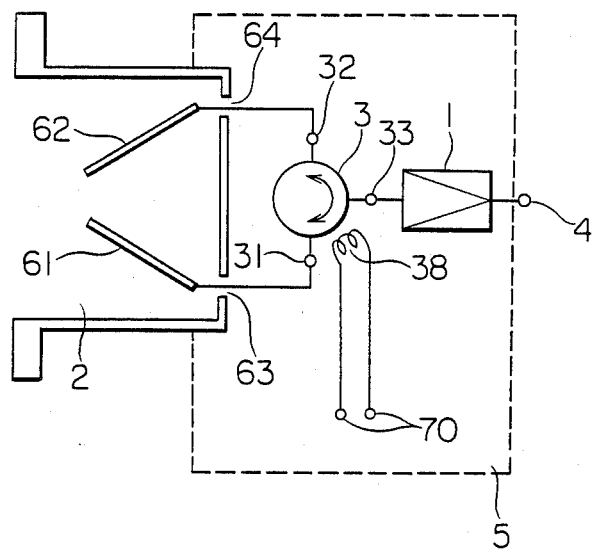
FIG. 4 is a setup diagram of a high-frequency amplifier device capable of switching and receiving signals of two polarized waves, according to an embodiment of this invention.

Now, one embodiment of this invention will be described with reference to the drawings. In FIG. 4, numeral 1 designates a high-frequency amplifier portion, numeral 2 a high-frequency input portion made of a waveguide which can transmit two polarized waves orthogonal to each other, numeral 3 a latching circulator, numeral 4 the signal output terminal of the amplifier device, and numeral 5 the case of the amplifier device. The latching circulator 3 has signal terminals 31, 32 and 33, and an excitation coil 38 which is provided with signal input terminals 70. Detector portion 61 and 62 independently detect the two polarized waves orthogonal to each other and entering the high-frequency input portion 2, respectively. The case 5 is provided with ports 63 and 64 for forming coaxial lines, by which signals detected by the detector portions 61 and 62 are respectively transmitted to the terminals 31 and 32 of the latching circulator 3.

Figure 5:
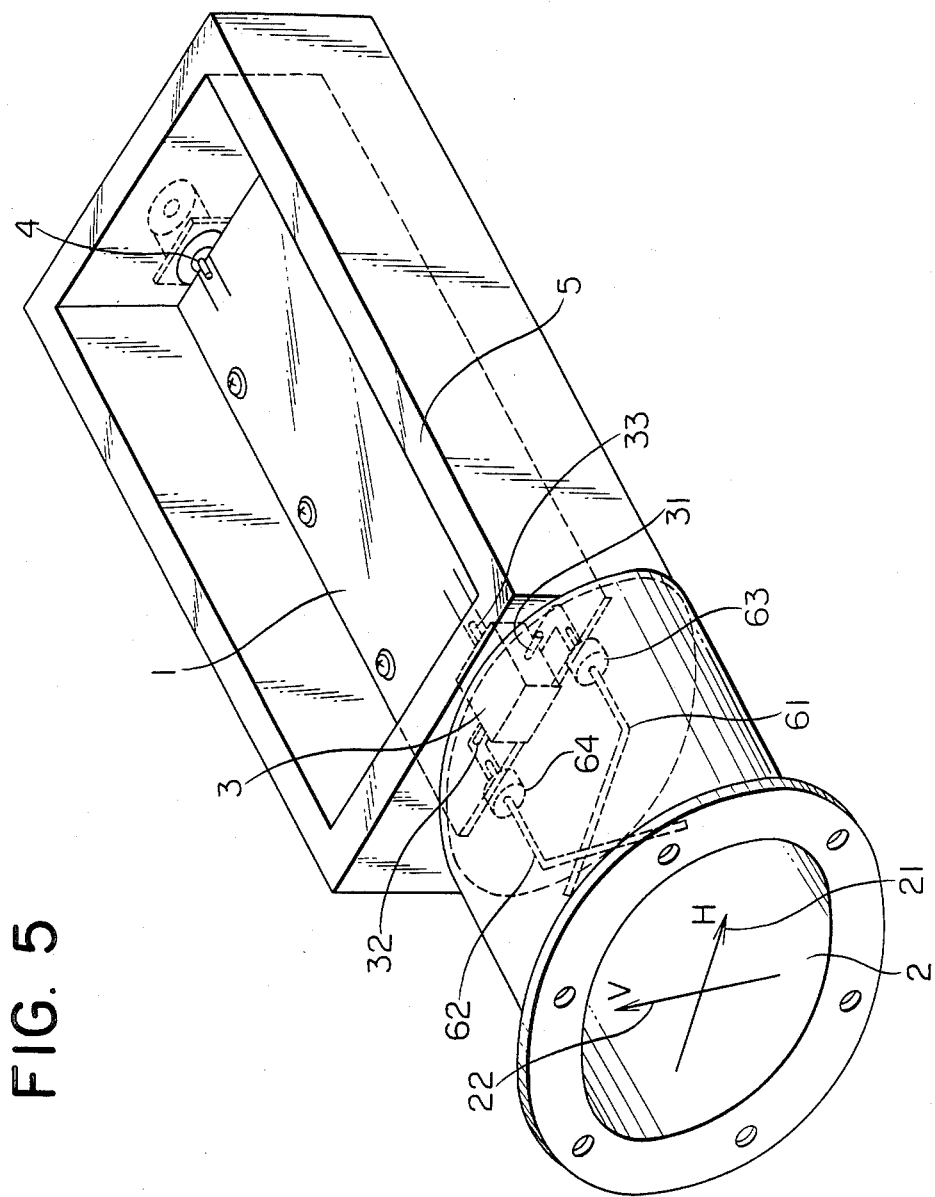
FIG. 5 is a perspective view showing an example of the practicable structure of the device in FIG. 4.
Figure 6:
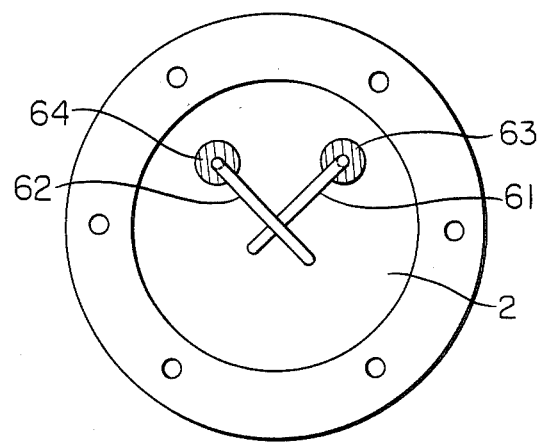
FIG. 6 is an exterior view of an input side in FIG. 5.
Figure 7:
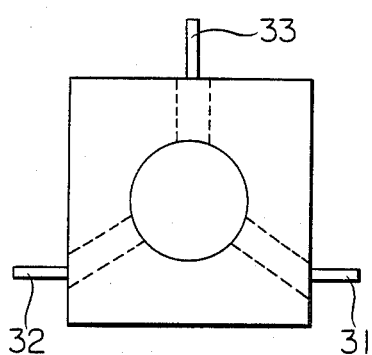
FIGS. 7 and 8 are constructional views showing an example of the construction of an irreversible element in FIGS. 4 and 5.
Figure 8:
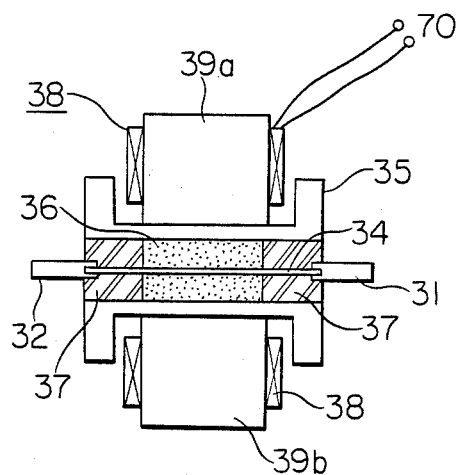

FIG. 5 is a structural view showing an example of the practicable structure of the embodiment of the present invention illustrated in FIG. 4, while FIG. 6 is a view of the high-frequency amplifier device in FIG. 5 as seen from the side of the high-frequency input portion 2 thereof. FIGS. 7 and 8 are structural views showing an example of the practicable structure of the latching circulator 3. In FIG. 8, numeral 34 indicates an inner conductor, numeral 35 an outer conductor, numeral 36 a ferrite plate, numeral 37 a dielectric plate, and numeral 38 the exciting coil. Symbols 39a and 39b denote members of a magnetic substance which serve as magnets.

In such a construction, the input to the high-frequency input portion 2 consists of the two signals of the polarized waves orthogonal to each other having the directions of electric fields 21 and 22 in FIG. 5, which are respectively termed a signal H and a signal V, and the detector portion 61 is mounted in parallel with the electric field 21, while the detector portion 62 is mounted in parallel with the electric field 22. When the detector portions are thus mounted, the signal H is detected by only the detector portion 61 and is sent to the terminal 31 of the latching circulator 3. On the other hand, the signal V is detected by only the detector portion 62 and is sent to the terminal 32 of the latching circulator 3. Now, let's consider a case where the directions of the magnetic fields of the magnets 39a and 39b of the latching circulator 3 are set so that the directions of rotating signals may become as follows:

Input to terminal 31→Output to terminal 33

Input to terminal 33→Output to terminal 32

Input to terminal 32→Output to terminal 31

Then, the high-frequency signals flow as stated below.

The H signal input is detected by the detector portion 61 and is input to the terminal 31, and it is output to the terminal 33 with a low loss. Therefore, the signal is amplified by the high-frequency amplifier portion 1 and is delivered from the signal output terminal 4 to another external device.

Figure 1:
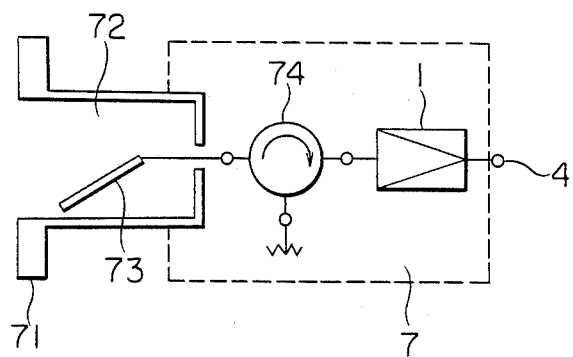
FIG. 1 is a setup diagram of a prior-art high-frequency amplifier device.
Figure 2:
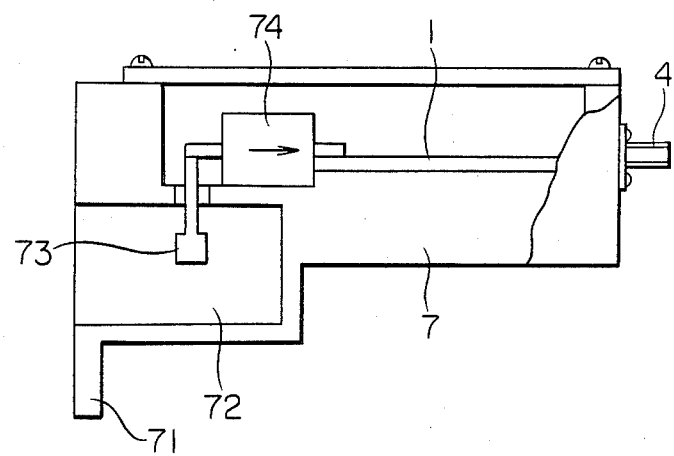
FIGS. 2 and 3 are exterior views of the prior-art high-frequency amplifier device.
Figure 3:
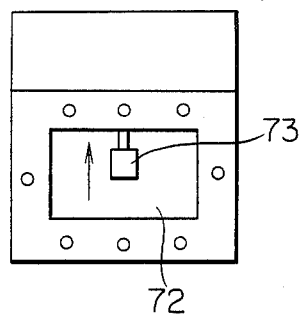

On the other hand, the V signal input is detected by the detector portion 62 and is input to the terminal 32 of the latching circulator 3. However, this signal is output to the terminal 31 with a low loss and does not appear at the terminal 33. The V signal delivered to the terminal 31 is output from the detector portion 61 to the high-frequency input portion 2 as a polarized wave in the direction of the electric field 21 and is sent back to an antenna portion (not shown) connected to the input portion 2, so that it is not transmitted to the high-frequency amplifier portion 1. Moreover, the H signal reflected from the high-frequency amplifier portion 1 to the terminal 33 on account of the mismatching of the input impedance of the high-frequency amplifier portion 1 is transmitted to the terminal 32 and is also sent back to the antenna portion via the detector portion 62, so that it is not reflected to the side of the terminal 31. In this way, the latching circulator 3 performs the function of mismatching elimination similarly to the irreversible circuit 74 of the prior-art high-frequency amplifier device in FIG. 1.

Next, when the V signal is to be amplified, a switching signal is applied to the coil 38 to invert the directions of the magnetic fields of the magnets 39a and 39b and to perform the signal rotation of the latching circulator 3 in the direction of the terminals 32→33→31→32. Thus, the V signal is detected by the detector portion 62 and is thereafter amplified by the high-frequency amplifier portion 1 via the terminals 32 and 33, whereupon the amplified V signal is delivered from the output terminal 4 to the external device. In this case, the H signal is not output to the output terminal 4.

While the above embodiment has been described as the high-frequency amplifier device which switchingly amplifies the two polarized wave inputs orthogonal to each other, the invention may well be applied as a high-frequency amplifier device which switchingly sends an antenna device two polarized waves orthogonal to each other, in such a way that the high-frequency amplifier portion is mounted with its input and output directions inverted to use the terminal 4 as an input terminal and the waveguide 2 as an output terminal.

Figure 9:
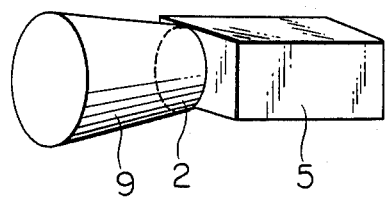
FIG. 9 is an exterior view showing another embodiment of this invention.

In addition, as illustrated in FIG. 9, the case 5 and the waveguide of the high-frequency input portion 2 which constitute the high-frequency amplifier device of the present invention are put into a structure unitary with the primary radiator 9 of an antenna, whereby a front end type primary radiator which is small in size and light in weight can be realized.

As described above, according to this invention, an input waveguide is fabricated in geometries capable of transmitting two orthogonal polarized waves, the waveguide is furnished with detector portions which detect the respective polarized waves independently, and the outputs of the detector portions can be switched and reveived by a latching circulator. Therefore, the invention produces the effect that a high-frequency amplifier device which can switch and receive the signals of the desired polarized waves with the single amplifier device can be realized inexpensively with a simple structure.

What is claimed is:

1. A high-frequency amplifier device comprising a high-frequency amplifier portion, a high-frequency input portion which is formed of a waveguide and which can transmit polarized signals orthogonal to each other, two detector portions which are inserted in said waveguide of said input portion and which independently detect the polarized wave signals orthogonal to each other, respectively, an irreversible circuit to which the polarized wave signals detected by said detector portions are individually input and which selectively and switchingly delivers one of the polarized wave signals to said high-frequency amplifier portion and returns the other polarized wave signal to the input portion, and switching control means to switch and control transmitting directions of said irreversible circuit in response to a control signal externally applied, whereby the two orthogonal polarized wave signals can be switched and amplified.

2. A high-frequency amplifier device as defined in claim 1, wherein said irreversible circuit is a latching circulator which has three terminals.

3. A high-frequency amplifier device comprising:
a high-frequency amplifier portion;
a high-frequency waveguide means for transmitting first and second polarized signals orthogonal to each other;
first and second detector portions inserted in the waveguide means for detecting the first and second polarized signals, respectively;
a three terminal latching circulator having a first terminal coupled to the first detector portion, a second terminal coupled to the second detector portion, and a third terminal coupled to the high-frequency amplifier portion; and
control means for switching the signal rotating directions of the latching circulator in response to a control signal externally applied, whereby either of the first and second signals is supplied to the high-frequency amplifier portion while the other polarized signal and any signal reflected from the high-frequency amplifier portion are returned to the waveguide means.

* * * * *